(12) United States Patent
Mishra et al.

(10) Patent No.: US 11,637,581 B2
(45) Date of Patent: Apr. 25, 2023

(54) SYSTEM AND METHOD FOR POWER AMPLIFIER CONTROL IN A MILLIMETER WAVE COMMUNICATION SYSTEM

(71) Applicant: QUALCOMM INCORPORATED, San Diego, CA (US)

(72) Inventors: Chinmaya Mishra, San Diego, CA (US); Nikhil Anand Muthya, San Diego, CA (US); Damin Cao, San Diego, CA (US); Shrenik Patel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/483,191

(22) Filed: Sep. 23, 2021

(65) Prior Publication Data
US 2023/0086058 A1 Mar. 23, 2023

(51) Int. Cl.
| | | |
|---|---|---|
| H04B 1/40 | (2015.01) | |
| H03F 3/24 | (2006.01) | |
| H04L 12/24 | (2006.01) | |
| H04L 12/08 | (2006.01) | |
| H04L 27/00 | (2006.01) | |

(Continued)

(52) U.S. Cl.
CPC .............. *H04B 1/40* (2013.01); *H03F 3/245* (2013.01); *H03G 3/3042* (2013.01); *H04W 52/365* (2013.01); *H03F 2200/451* (2013.01); *H03G 2201/103* (2013.01); *H03G 2201/307* (2013.01)

(58) Field of Classification Search
None
See application file for complete search history.

(56) References Cited

U.S. PATENT DOCUMENTS

| | | | |
|---|---|---|---|
| 8,447,249 B1 | 5/2013 | Lu et al. | |
| 10,560,233 B2 * | 2/2020 | Yang ................. | H04W 72/0453 |

(Continued)

FOREIGN PATENT DOCUMENTS

| | | |
|---|---|---|
| EP | 3073572 A1 | 9/2016 |
| EP | 3633941 A1 | 4/2020 |

(Continued)

OTHER PUBLICATIONS

Partial International Search Report—PCT/US2022/041971—ISA/EPO—dated Dec. 15, 2022.

(Continued)

*Primary Examiner* — Pablo N Tran
(74) *Attorney, Agent, or Firm* — Smith Tempel Blaha LLC/Qualcomm

(57) ABSTRACT

A system for power amplifier control includes a processor, a memory in communication with the processor, wherein the processor and the memory are configured to simultaneously provide input signal strength of each of a plurality of power amplifiers in a millimeter wave (mmW) phased array system, determine an average input signal strength of the plurality of power amplifiers based on the provided input signal strengths using an analog-to-digital converter (ADC), determine a voltage headroom for the plurality of power amplifiers based on the determined average input signal strength, estimate a power backoff value based on the voltage headroom, and determine a gain control value based on the estimated power backoff value.

29 Claims, 13 Drawing Sheets

(51) Int. Cl.
      *H04L 5/00*       (2006.01)
      *H04W 52/36*     (2009.01)
      *H03G 3/30*       (2006.01)

(56) References Cited

U.S. PATENT DOCUMENTS

| | | | |
|---|---|---|---|
| 10,560,905 B2 * | 2/2020 | Ryoo | ............ H04L 5/0007 |
| 2014/0329551 A1 * | 11/2014 | Ryoo | ............ H04W 76/27 |
| | | | 455/522 |
| 2018/0115282 A1 | 4/2018 | Thyagarajan et al. | |

FOREIGN PATENT DOCUMENTS

| | | | | |
|---|---|---|---|---|
| EP | 3603231 B1 * | 9/2021 | ......... | H04L 27/0008 |
| EP | 3952109 A1 | 2/2022 | | |
| WO | 2020177860 A1 | 9/2020 | | |
| WO | 2020220715 A1 | 11/2020 | | |

OTHER PUBLICATIONS

International Search Report—PCT/US2022/041971—ISA/EPO—dated Mar. 16, 2023.

* cited by examiner

600

| Calibration | | | | | | |
|---|---|---|---|---|---|---|
| Antenna Port | AGC Index | PDET (dBm) | RDET (mV) | Gain Adjustment | RDET Threshold (25C) | @25 C |
| 1 | 40 | 14 | | -2 | | |
| 2 | 40 | 12.5 | | -0.5 | | |
| 3 | 40 | 12 | | 0 | | |
| 4 | 40 | 13 | | -1 | | |
| 1 | 42 | 14 | 190 | -2 | 238 | 48 |
| 2 | 42 | 14 | 193 | -0.5 | 238 | 45 |
| 3 | 42 | 14 | 198 | 0 | 238 | 40 |
| 4 | 42 | 14 | 195 | -1 | 238 | 43 |
| | | RDET_avg_cal | 194 | | Min DISTANCE | 40 |
| | | RDET_max_cal | 198 | | | |
| | | ΔRDET_cal | 4 | | | |

605 = rows with AGC Index 40; 610 = rows with AGC Index 42

| PDET | RDET_avg_op | Temp | ΔRDET_cal | Threshold | Distance | Backoff |
|---|---|---|---|---|---|---|
| 15 | 204 | 25 | 4 | 238 | 30 | 0 |
| 15 | 235 | 40 | 4 | 248 | 9 | 0 |
| 15 | 265 | 75 | 4 | 258 | -11 | -0.18 |
| 15 | 290 | 80 | 4 | 262 | -32 | -0.50 |

*FIG. 8*

SYSTEM AND METHOD FOR POWER AMPLIFIER CONTROL IN A MILLIMETER WAVE COMMUNICATION SYSTEM

FIELD

The present disclosure relates generally to electronics, and more specifically to radio frequency (RF) transmitters and receivers.

BACKGROUND

Wireless communication devices and technologies are becoming ever more prevalent, as are communication devices that operate at millimeter-wave (mmW) frequencies. Wireless communication devices generally transmit and/or receive communication signals.

A communication signal is typically processed by a variety of different components and circuits. In some modern communication systems, a communication beam may be formed and steered in one or more directions. One type of beam steering system uses what is referred to as phased array, or phased array antenna system. A phased array may use a number of different elements and antennas where each element may process a transmit and/or receive signal that is offset in phase by some amount, leading to different elements of a phased array system processing slightly phase-shifted versions of a transmit and/or a receive signal. A phased array system may produce narrow, steerable, high power communication beams. A phased array antenna system may also form part of a massive multiple-input, multiple-output (MIMO) system. A transmitter in a phased array communication system may have a number of transmit paths and may have a number of amplifiers, including a number of power amplifiers. A variety of factors influence the operation of a power amplifier, including, for example, input signal strength, input impedance, output impedance, load impedance, and other factors. These factors may influence the longevity and reliability of a power amplifier. It is desirable to have a way to ensure that each power amplifier operates within an acceptable operating range to maximize longevity and reliability.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a system for power amplifier control including a processor, a memory in communication with the processor, wherein the processor and the memory are configured to simultaneously provide input signal strength of each of a plurality of power amplifiers in a millimeter wave (mmW) phased array system, determine an average input signal strength of the plurality of power amplifiers based on the provided input signal strengths using an analog-to-digital converter (ADC), determine a voltage headroom for the plurality of power amplifiers based on the determined average input signal strength, estimate a power backoff value based on the voltage headroom, and determine a gain control value based on the estimated power backoff value.

Another aspect of the disclosure provides a method for power control including simultaneously providing input signal strength of each of a plurality of power amplifiers in a millimeter wave (mmW) phased array system, determining an average input signal strength of the plurality of power amplifiers based on the provided input signal strengths, determining a voltage headroom based on the determined average input signal strength, estimating a power backoff value based on the determined voltage headroom, and determining a gain control value to achieve the estimated power backoff value.

Another aspect of the disclosure provides a device including means for simultaneously providing input signal strength of each of a plurality of power amplifiers in a millimeter wave (mmW) phased array system, means for determining an average input signal strength of the plurality of power amplifiers based on the provided input signal strengths, means for determining a voltage headroom based on the determined average input signal strength, means for estimating a power backoff value based on the determined voltage headroom, and means for determining a gain control value to achieve the estimated power backoff value.

Another aspect of the disclosure provides a power control system for a millimeter wave (mmW) communication system including a plurality of transmission paths, each transmission path having a power amplifier, and an input power detector, an analog-to-digital converter (ADC) coupled to each input power detector, the ADC configured to generate a single digital value for a plurality of input voltage signals corresponding to an input voltage of each power amplifier within a symbol, a variable gain amplifier (VGA) coupled to the plurality of transmission paths, and a processor configured to cause a control signal to be applied to the variable gain amplifier (VGA) responsive to the single digital value.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

FIG. 6 is an exemplary calibration chart.

FIG. 8 is a chart showing power amplifier backoff at various temperatures.

DETAILED DESCRIPTION

Figure 1:
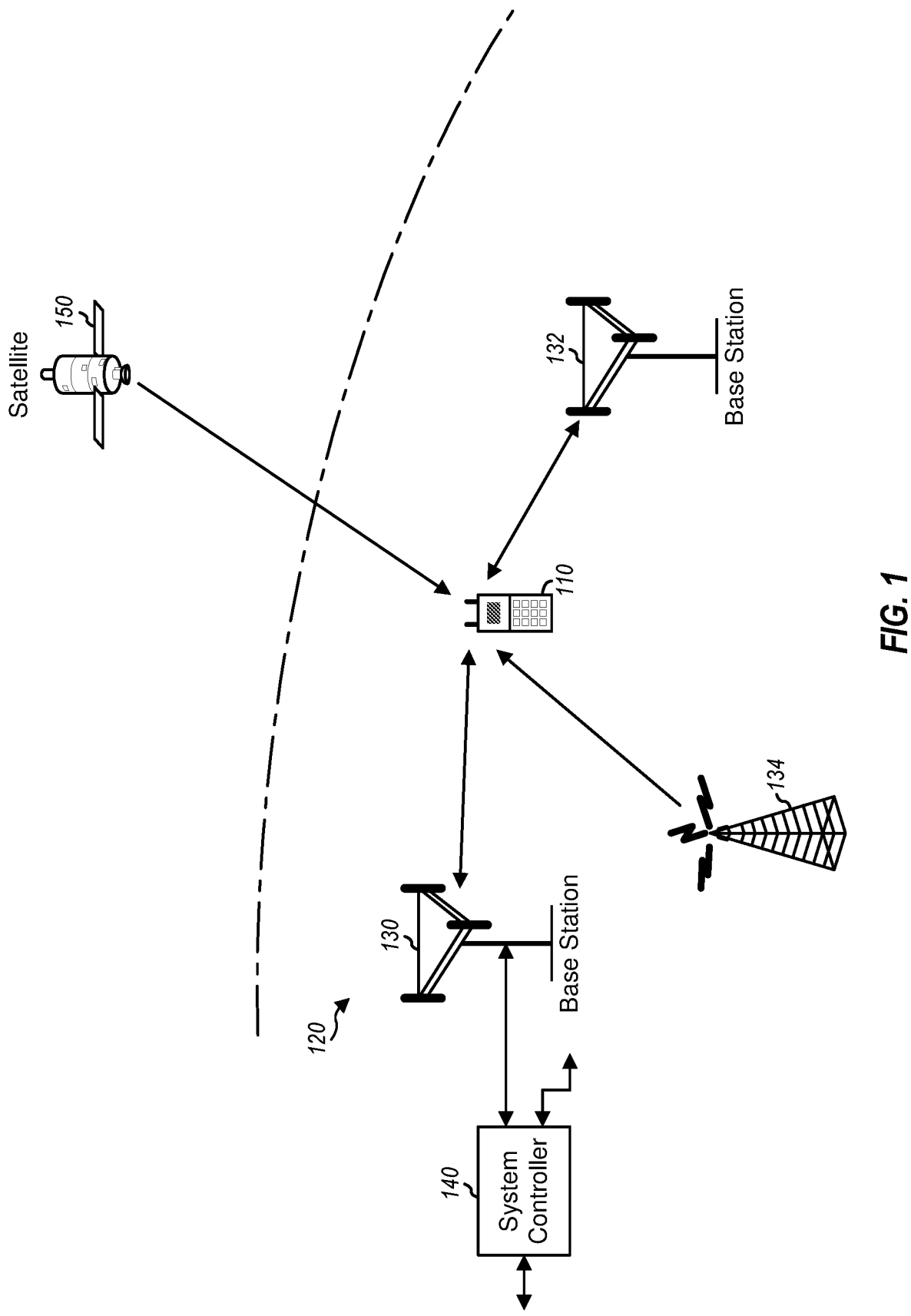
FIG. 1 is a diagram showing a wireless device communicating with a wireless communication system.

The word "exemplary" is used herein to mean "serving as an example, instance, or illustration." Any aspect described herein as "exemplary" is not necessarily to be construed as preferred or advantageous over other aspects.

In a communication system that uses a phased array antenna system having phased array elements, each phased array element typically includes a power amplifier. Factors that may influence the operation of each power amplifier include, for example, input signal strength, input impedance, output impedance, load impedance, and other factors. It is desirable to have a way to ensure that each power amplifier operates within an acceptable operating range to maximize longevity and reliability.

Each power amplifier may include an input power detector and an output power detector. An input power detector may be referred to as an RDET (reliability input power detector), and an output power detector may be referred to as a PDET (power detector, or output power detector).

An RDET may be part of an input protection circuit to prevent over-driving the power amplifier, which can degrade performance and long term reliability. An RDET detects the voltage swing, or voltage level, at the input of the power amplifier. Information about individual power amplifier input voltage swings in a phased array antenna system is important to determine if a certain power amplifier has crossed an input level threshold. The input level of each power amplifier in a phased array system may differ due to the use of a technique referred to as mismatch calibration, which aligns power amplifier output, but can lead to differences in the input level provided to each power amplifier. Differences in power amplifier input power could also result from the use of digital pre-distortion (DPD) calibration based on different antenna loading per phased array element.

Architectures for power estimation that rely on simultaneous summing of signals from multiple elements help in improving error accuracy, especially for narrow resource block (RB) signals, and also reduce the overall time of measurement, both of which are very important in mission mode. However, known methods do not provide any information for individual power amplifiers or power amplifier elements in real time. For example, a prior method for determining power amplifier input power in a phased array system having eight (8) elements reads the output of one RDET at a time for a total of eight (8) RDET outputs in each symbol period. However, given the short duration of a communication symbol, there is little time to accurately obtain input power measurements for eight (8) power amplifiers, leading to as much as a 2 dB variation in input power for narrow RB waveforms using this prior technique.

Therefore, it would be desirable to have a way of measuring power amplifier input power in a phased array antenna system that accurately captures values for multiple power amplifiers in a short period of time.

In an exemplary embodiment, a system and method for power amplifier input control includes a calibration system and method that captures an average input power across multiple power amplifiers in a millimeter wave (mmW) phased array system.

In an exemplary embodiment, a system and method for power amplifier input control includes a real time power control system that uses the average input power across multiple power amplifiers to develop a power control system for the power amplifiers in the phased array system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS)), etc). Wireless device 110 may support one or more radio technologies for wireless communication such as LTE, WCDMA, CDMA 1x, EVDO, TD-SCDMA, GSM, 802.11, 5G, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2A:
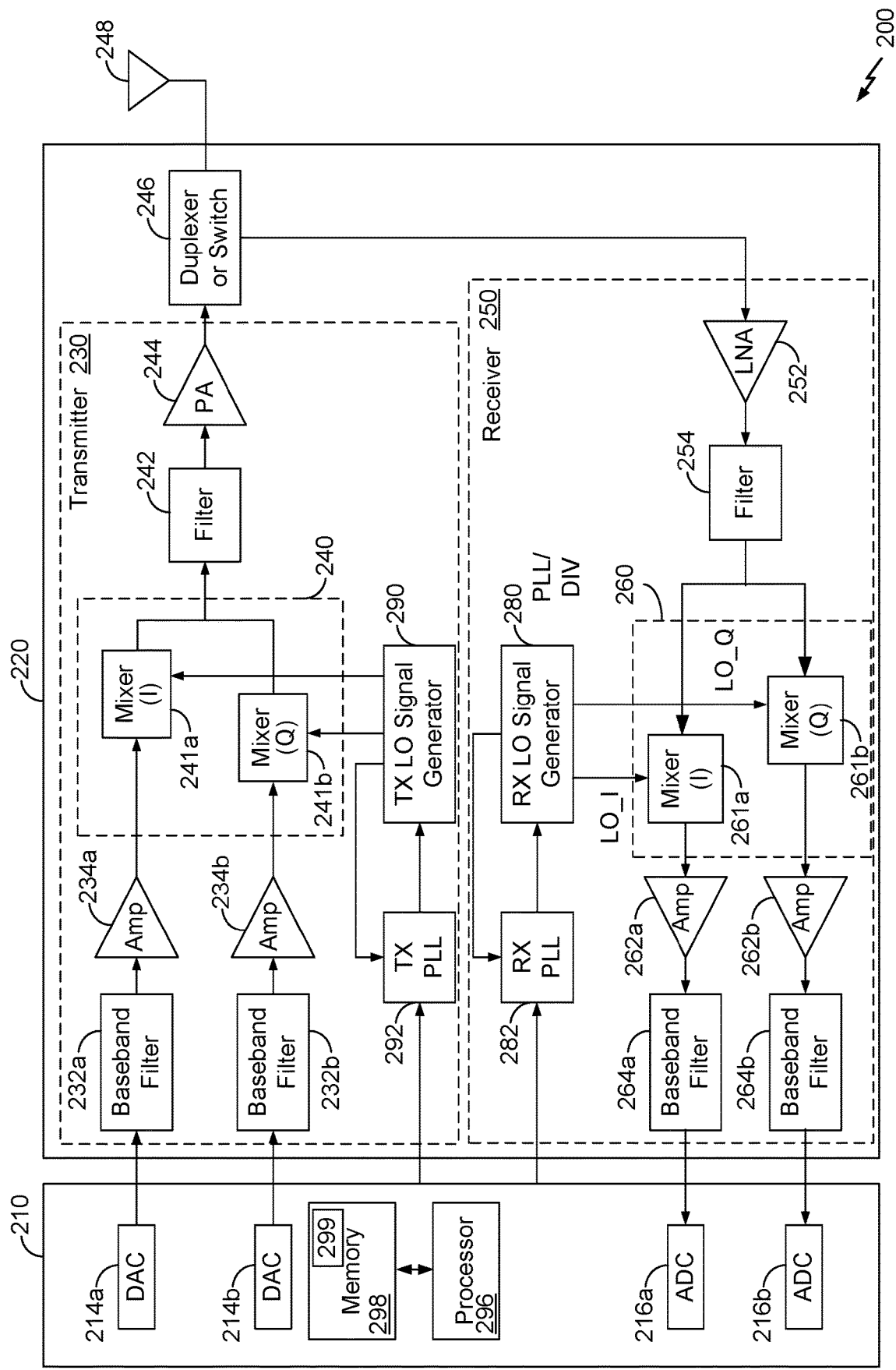
FIG. 2A is a block diagram showing a wireless device in which exemplary techniques of the present disclosure may be implemented.

FIG. 2A is a block diagram showing a wireless device 200 in which exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The processor 296 and the memory 298 may cooperate to control, configure, program, or otherwise fully or partially control some or all of the operation of the embodiments of the system and method for power amplifier input control described herein.

The transceiver 220 includes a transmitter 230 and a receiver 250 that support bidirectional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, baseband (e.g., lowpass) filters 232a and 232b filter the I and Q analog transmit signals, respectively, to remove undesired images caused by the prior digital-to-analog conversion. Amplifiers (Amp) 234a and 234b amplify the signals from baseband filters 232a and 232b, respectively, and provide I and Q baseband signals. An upconverter 240 having upconversion mixers 241a and 241b upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248. While examples discussed herein utilize I and Q signals, those of skill in the art will understand that components of the transceiver may be configured to utilize polar modulation.

In the receive path, antenna 248 receives communication signals and provides a received RF signal, which may be routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by baseband (e.g., lowpass) filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the PA 244 and LNA 252 (and filter 242 and filter 254 in some examples) may be implemented separately from other components in the transmitter 230 and receiver 250, for example on a millimeter wave integrated circuit. An example super-heterodyne architecture is illustrated in FIG. 2B.

Figure 2B:
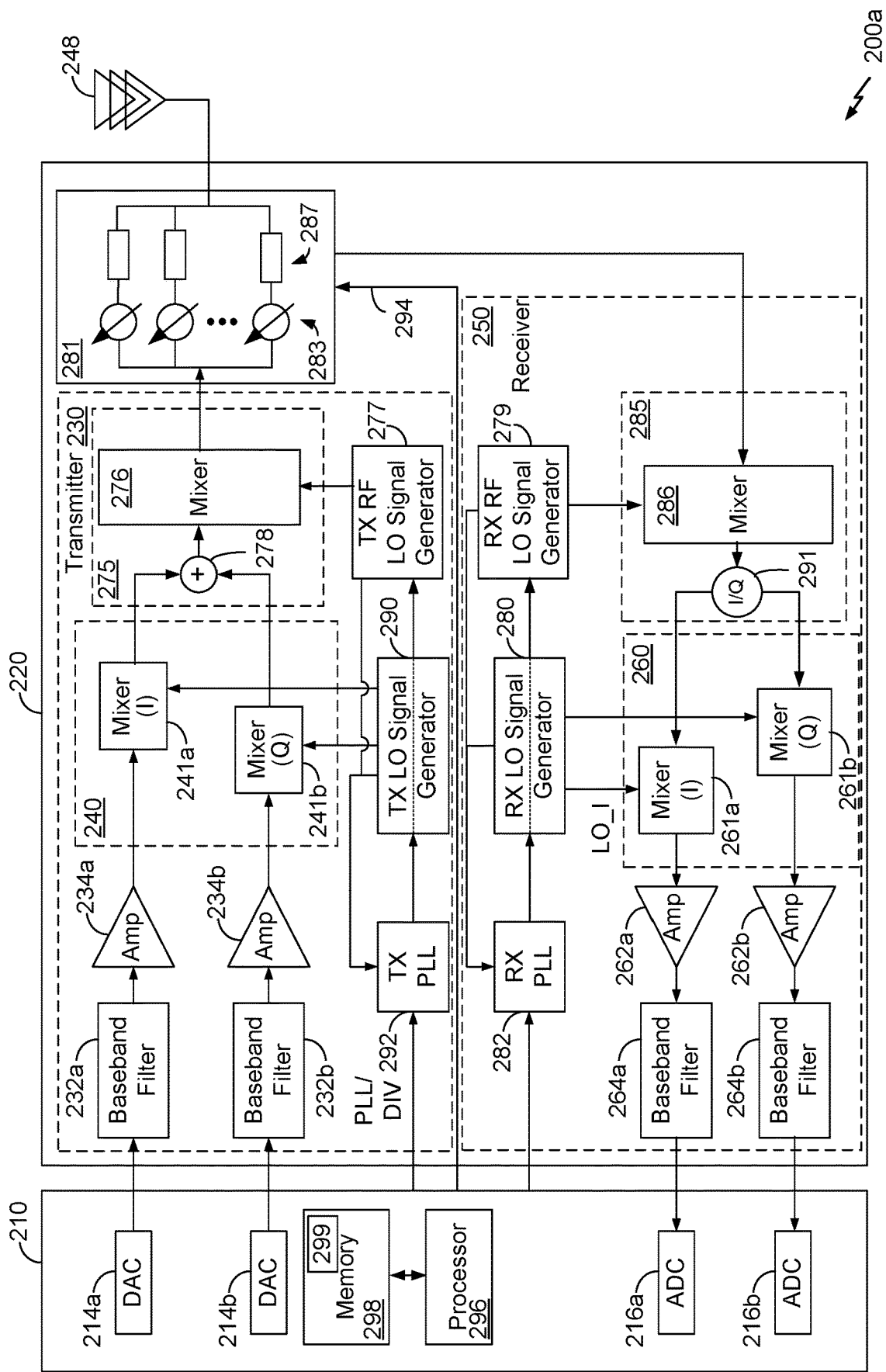
FIG. 2B is a block diagram showing a wireless device in which exemplary techniques of the present disclosure may be implemented.

FIG. 2B is a block diagram showing a wireless device in which exemplary techniques of the present disclosure may be implemented. Certain components, for example which may be indicated by identical reference numerals, of the wireless device 200a in FIG. 2B may be configured similarly to those in the wireless device 200 shown in FIG. 2A and the description of identically numbered items in FIG. 2B will not be repeated.

The wireless device 200a is an example of a heterodyne (or superheterodyne) architecture in which the upconverter 240 and the downconverter 260 are configured to process a communication signal between baseband and an intermediate frequency (IF). For example, the upconverter 240 may be configured to provide an IF signal to an upconverter 275. In an exemplary embodiment, the upconverter 275 may comprise summing function 278 and upconversion mixer 276. The summing function 278 combines the I and the Q outputs of the upconverter 240 and provides a non-quadrature signal to the mixer 276. The non-quadrature signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and/or power amplifiers. In some embodiments, the phase shifters 283 may be incorporated within respective phased array elements 287.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise an I/Q generation function 291 and a downconversion mixer 286. In an exemplary embodiment, the mixer 286 downconverts the receive RF signal provided by the phase shift circuitry 281 to an IF signal according to RX RF LO signals provided by an RX RF LO signal generator 279. The I/Q generation function 291 receives the IF signal from the mixer 286 and generates I and Q signals for the downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect. For example, components of the antenna array 248 may be implemented on a substrate and coupled to an integrated circuit implementing the phase shift circuitry 281 via a flexible printed circuit.

In some embodiments, both the architecture illustrated in FIG. 2A and the architecture illustrated in FIG. 2B are implemented in the same device. For example, a wireless device 110 or 200 may be configured to communicate with signals having a frequency below about 20 GHz using the architecture illustrated in FIG. 2A and to communicate with signals having a frequency above about 20 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B. While certain example frequencies are described herein, other implementations are possible. For example, signals having a frequency above about 20 GHz (e.g., having a mmW frequency) may be transmitted and/or received using a direct conversion architecture. In such embodiments, for example, a phased array may be implemented in the direct conversion architecture.

Figure 2C:
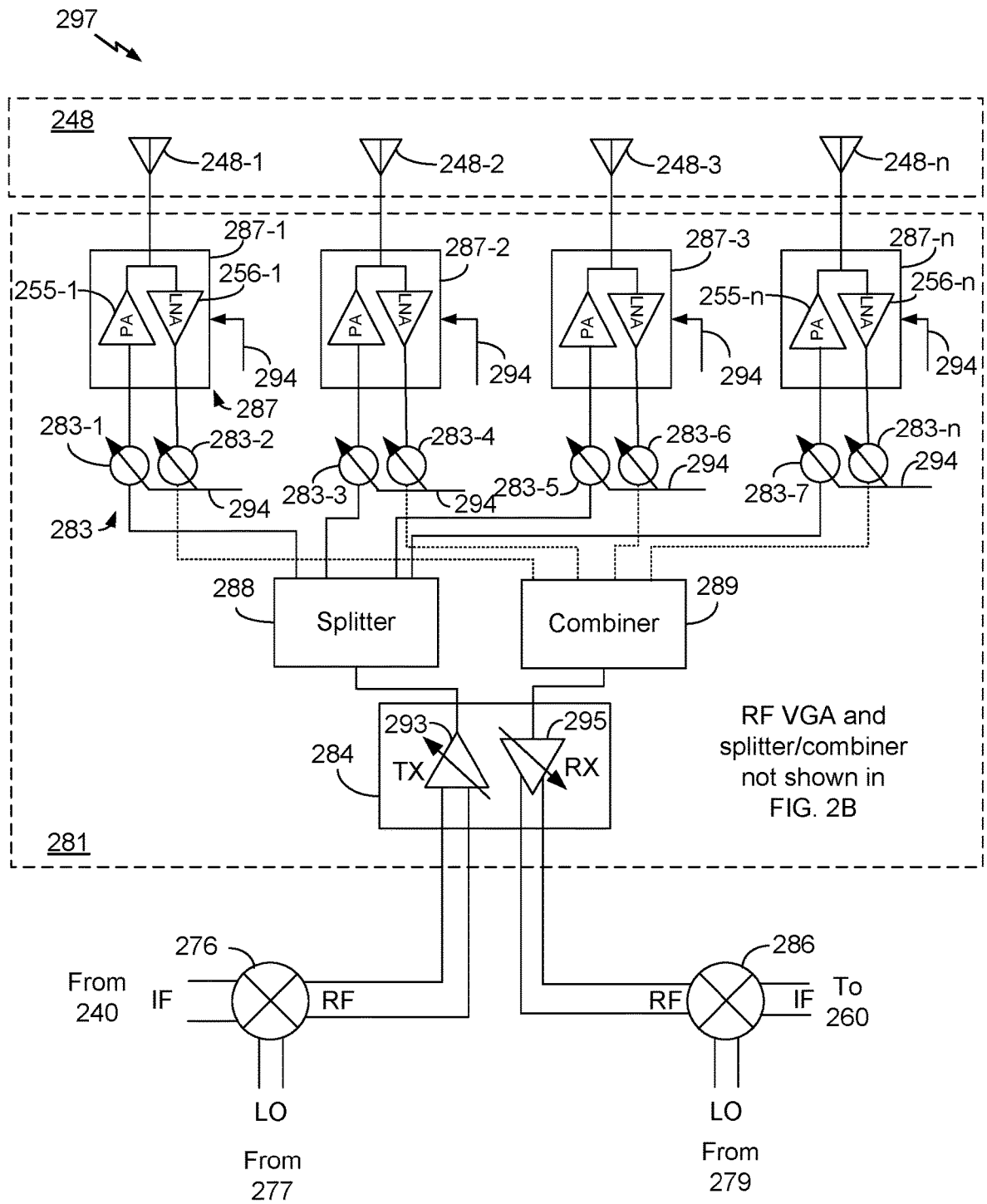
FIG. 2C is a block diagram showing in greater detail some of the components of FIG. 2B.

FIG. 2C is a block diagram 297 showing in greater detail an embodiment of some of the components of FIG. 2B. In an exemplary embodiment, the upconversion mixer 276 provides an RF transmit signal to the phase shift circuitry 281 and the downconversion mixer 286 receives an RF receive signal from the phase shift circuitry 281. In an exemplary embodiment, the phase shift circuitry 281 comprises an RF variable gain amplifier (VGA) 284, a splitter 288, a combiner 289, the phase shifters 283 and the phased array elements 287. In an exemplary embodiment, the phase shift circuitry 281 may be implemented on a millimeter-wave integrated circuit (mmWIC). In some such embodiments, the upconverter 275 and/or the downconverter 285 (or just the mixers 276, 286) are also implemented on the mmWIC. In an exemplary embodiment, the RF VGA 284 may comprise a TX VGA 293 and an RX VGA 295. In some embodiments, the TX VGA 293 and the RX VGA 295 may be implemented independently. In other embodiments, the RF VGA 284 is bidirectional. In an exemplary embodiment, the splitter 288 and the combiner 289 may be an example of, or may comprise a power distribution network and a power combining network. In some embodiments, the splitter 288 and the combiner 289 may be implemented as a single component or as a separate signal splitter and signal combiner as shown. The phase shifters 283 may be implemented as separate transmit (TX) and receive (RX) phase shifters, or may be implemented as TX/RX bidirectional phase shifters. The phase shifters 283 may be coupled to respective phased array elements 287. In an exemplary embodiment, each phased array element may comprise a power amplifier (PA) 255 and a low noise amplifier (LNA) 256. Each PA 255 may comprise one or more amplifiers or amplifier stages including, for example, one or more driver amplifiers and one or more power amplifiers. Each LNA 256 may comprise one or more amplifiers or amplifier stages. In an exemplary embodiment, a phase shifter 283 may be coupled to a PA 255 and to an LNA 256. Each respective phased array element 287 having a PA 255 and an LNA 256 is coupled to a respective antenna element in the antenna array 248. In an exemplary embodiment, phase shifters 283 and the phased array elements 287 receive control signals from the data processor 210 over connection 294. The exemplary embodiment shown in FIG. 2C comprises a 1×4 array having four TX phase shifters 283-1, 283-3, 283-5 and 283-7; and four RX phase shifters 283-2, 283-4, 283-6 and 283-n; four phased array elements 287-1, 287-2, 287-3 and 287-n, and four antennas 248-1, 248-2, 248-3 and 248-n. However, a 1×4 phased array is shown for example only, and other configurations, such as 1×2, 1×6, 1×8, 2×3, 2×4, or other configurations are possible. Further, each PA 255 and LNA 256 of a phased array element 287 may share a common signal pin to reduce circuit area. However, in other embodiments, each PA 255 and LNA 256 of a phased array element 287 can have an independent pin and rely on module routing or the respective antenna element to couple Tx and Rx together.

Examples illustrated with respect to FIGS. 2B and 2C implement phase shifting (e.g., using phase shifters 283) in a signal path of the wireless device 200a. In other examples, the phase shifters 283 are omitted, and a phase of a signal may be adjusted by varying a phase at the mixers 276, 286. In some examples, the LO signal generators 277, 279 are configured to provide oscillating signals having varied phase in order to produce TX and/or RX signals having different phases. In some such examples, more than one mixer is implemented for the TX path and/or the RX path in the circuitry 281.

Figure 3:
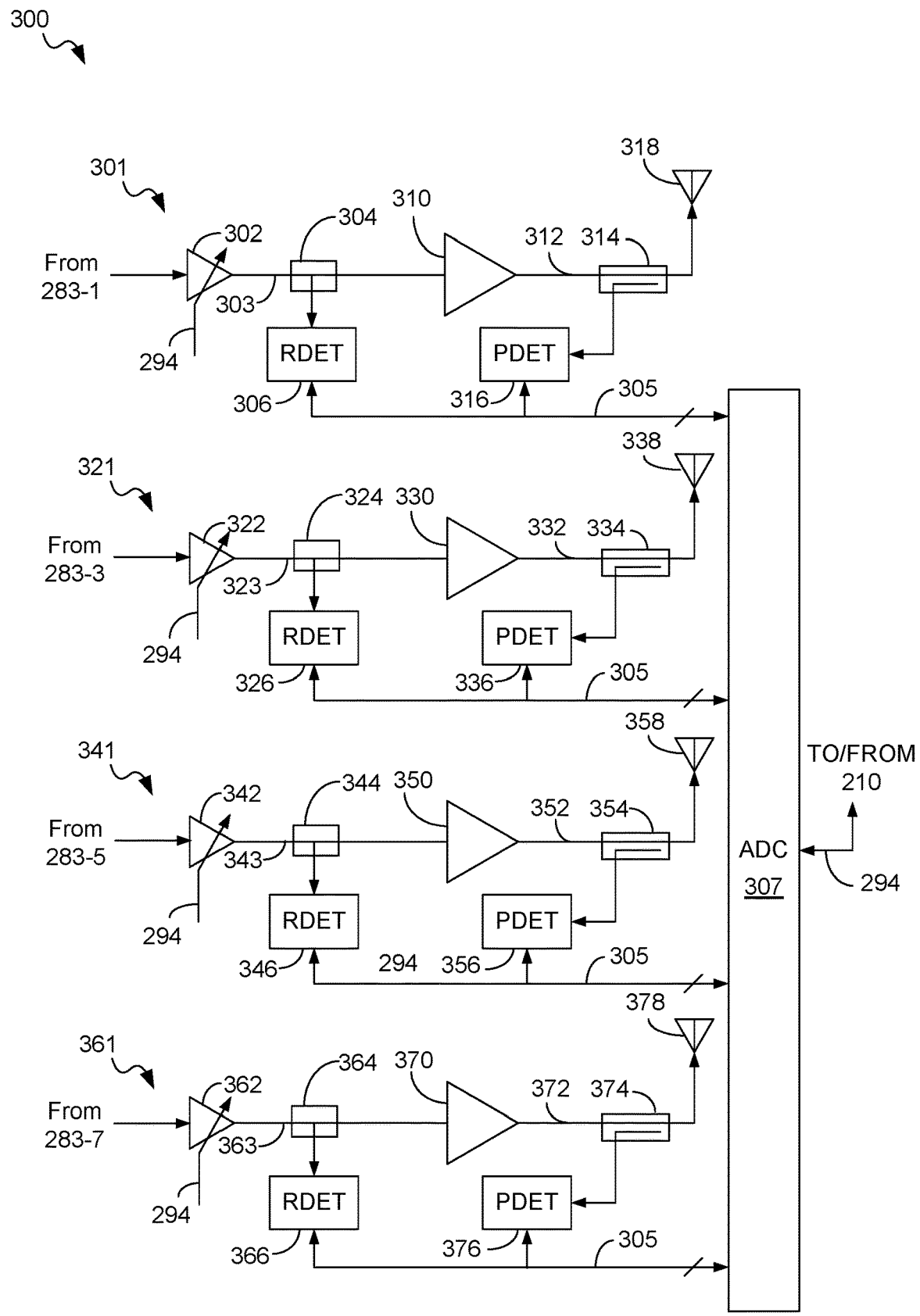
FIG. 3 is a block diagram of a power detection system in accordance with an exemplary embodiment of the disclosure.

FIG. 3 is a block diagram of a portion of a phased array circuit 300 in accordance with an exemplary embodiment of the disclosure. In an exemplary embodiment, the phased array circuit 300 is an example of a phased array transmit system having four (4) transmit paths 301, 321, 341 and 361. The phased array circuit 300 may also be referred to as a phased array. Four transmit paths are shown for example only, as more or fewer transmit paths may be implemented in a phased array system. In an exemplary embodiment, the transmit paths 301, 321, 341 and 361 may be configured to receive respective outputs of the phase shifters 283-1, 283-3, 283-5 and 283-7 of FIG. 2C, or configured to receive signals that have varied phases produced using other means.

In an exemplary embodiment, the transmit path 301 may comprise one or more driver amplifiers, shown as a single driver amplifier 302 in this example, a power amplifier 310 and an antenna 318. The transmit path 301 may also comprise an input power detector (referred to as a reliability input power detector RDET) 306 and an output power detector, PDET 316. The output power detector, PDET 316, may be coupled to the connection 312 between the power amplifier 310 and the antenna 318 using a (power) coupler 314. The input power detector, RDET 306, may be coupled to the connection 303 between the driver amplifier 302 and the power amplifier 310 using a (power) coupler 304. In an exemplary embodiment, the power amplifier 310 may be an example of one of the power amplifiers 255 in FIG. 2C. In an exemplary embodiment, the input power detectors, RDETs 306, 326, 346 and 366, may be configured to measure an input voltage swing at the input to respective power amplifiers 310, 330, 350 and 370. As used herein, the term "input power" may also be referred to as "input voltage swing" or "voltage swing."

In an exemplary embodiment, the transmit path 321 may comprise one or more driver amplifiers, shown as a single driver amplifier 322 in this example, a power amplifier 330 and an antenna 338. The transmit path 321 may also comprise an input power detector, RDET 326 and an output power detector, PDET 336. The output power detector, PDET 336, may be coupled to the connection 332 between the power amplifier 330 and the antenna 338 using a (power) coupler 334. The input power detector, RDET 326, may be coupled to the connection 323 between the driver amplifier 322 and the power amplifier 330 using a (power) coupler 324. In an exemplary embodiment, the power amplifier 330 may be an example of one of the power amplifiers 255 in FIG. 2C.

In an exemplary embodiment, the transmit path 341 may comprise one or more driver amplifiers, shown as a single driver amplifier 342 in this example, a power amplifier 350 and an antenna 358. The transmit path 341 may also comprise an input power detector, RDET 346 and an output power detector, PDET 356. The output power detector, PDET 356, may be coupled to the connection 352 between the power amplifier 350 and the antenna 358 using a (power) coupler 354. The input power detector, RDET 346, may be coupled to the connection 343 between the driver amplifier 342 and the power amplifier 350 using a (power) coupler 344. In an exemplary embodiment, the power amplifier 350 may be an example of one of the power amplifiers 255 in FIG. 2C.

In an exemplary embodiment, the transmit path 361 may comprise one or more driver amplifiers, shown as a single driver amplifier 362 in this example, a power amplifier 370 and an antenna 378. The transmit path 361 may also comprise an input power detector, RDET 366 and an output power detector, PDET 376. The output power detector, PDET 376, may be coupled to the connection 372 between the power amplifier 370 and the antenna 378 using a (power) coupler 374. The input power detector, RDET 366, may be coupled to the connection 363 between the driver amplifier 362 and the power amplifier 370 using a (power) coupler 364. In an exemplary embodiment, the power amplifier 370 may be an example of one of the power amplifiers 255 in FIG. 2C.

In an exemplary embodiment, each driver amplifier 302, 322, 342 and 362 may be coupled over connection 294 to the data processor 210 (FIG. 2B), from which respective control signals may be applied to the driver amplifiers 302, 322, 342 and 362. In an exemplary embodiment, each RDET 306, 326, 346 and 366 and each PDET 316, 336, 356 and 376 may be coupled over a connection 305 to an analog-to-digital converter (ADC) 307. The ADC 307 may be coupled over connection 294 to the data processor 210 (FIG. 2B). In an exemplary embodiment, the ADC 307 may be located on the same circuit, chip or die as the driver amplifiers, power amplifiers, input power detectors and/or output power detectors. Alternatively, the ADC 307 may be located on circuitry other than the circuitry on which the driver amplifiers, power amplifiers, input power detectors and/or output power detectors are located. Further, separate ADCs may be implemented for one or more of the transmit paths and/or for one or more of the RDET(s) and PDET(s) instead of having one ADC coupled to all of the RDETs and PDETs. In an exemplary embodiment, the ADC 307 may receive power measurements from the input power detectors, RDETs 306, 326, 346 and 366, and may receive power measurements from the output power detectors, PDETs 316, 336, 356 and 376 over connection 305. In an exemplary embodiment, the connection 305 may comprise a communication bus configured to transport multiple signals simultaneously. In an exemplary embodiment, the measurements from the input power detectors and output power detectors may be provided to the ADC 307. In an exemplary embodiment, the ADC 307 may develop one or more signals representative of the power detected by the input power detectors, RDETs, 306, 326, 346 and 366, and may develop one or more signals representative of the power detected by the output power detectors, PDETs, 316, 336, 356 and 376. The ADC 307 may be in communication with the data processor 210 (FIG. 2B) and the data processor 210 may be configured to perform calculations on the power measurement signals developed by the ADC 307. Similarly, the data processor 210 may control the operation of each of the driver amplifiers and indirectly, the power amplifiers, in some embodiments, responsive to the power detected by the input power detectors and the output power detectors. In other examples, the data processor 210 may directly control operation of one or more of the power amplifiers.

In an exemplary embodiment, the data processor 210 may develop control signals for the driver amplifiers 302, 322, 342 and 362 to provide power control. In an exemplary embodiment, there are two controls: one control is a coarse control referred to as automatic gain control, (AGC), and the other control is a fine control. The fine control may be used to perform power amplifier power output mismatch calibration as described herein and in an exemplary embodiment, can be done in the driver amplifiers 302, 322, 342 and 362 to indirectly control the power provided by the power amplifiers 310, 330, 350 and 370. The coarse power control (AGC) may be done in a VGA, such as in the RF VGA 284 of FIG. 2C because in this example the RF VGA 284 is common to all transmit paths 301, 321, 341 and 361. The coarse control (AGC) may also be used for power backoff as will be described below.

In an exemplary embodiment, each antenna 318, 338, 358 and 378 may be associated with a communication port. For example, antenna 318 may be associated with a first communication port (port 1), antenna 338 may be associated with a second communication port (port 2), antenna 358 may be associated with a third communication port (port 3), and antenna 378 may be associated with a fourth communication port (port 4).

Figure 4:
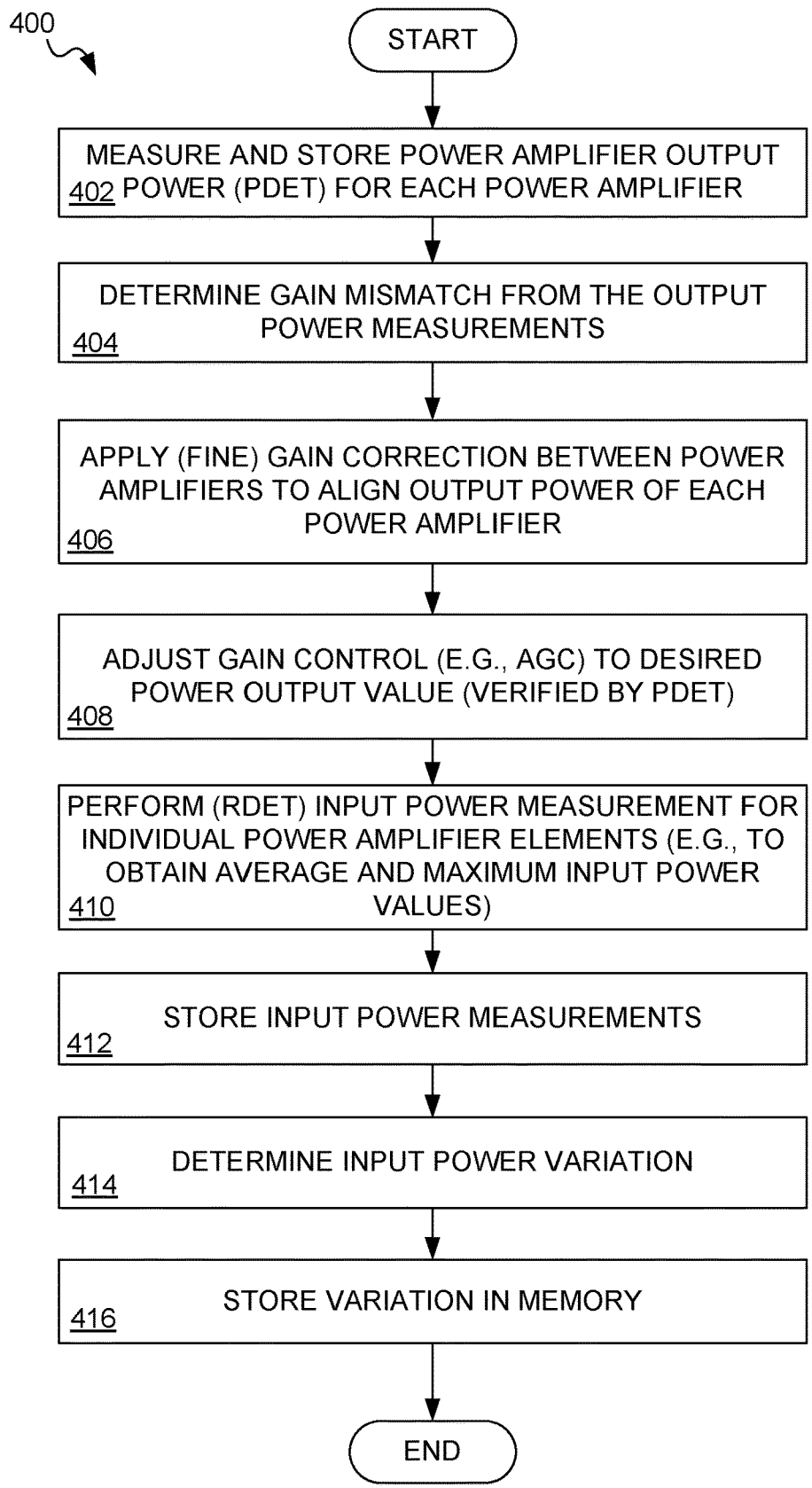
FIG. 4 is a flow chart describing an example of the operation of a method for input power detection and power amplifier output calibration.

FIG. 4 is a flow chart 400 describing an example of the operation of a method for input power detection and power amplifier output calibration. The blocks in the method 400 can be performed in or out of the order shown, and in some embodiments, can be performed at least in part in parallel. The description of the method 400 will also refer to an exemplary calibration chart 600 shown in FIG. 6. The operations described with respect to chart 400 may be performed during a factory calibration of a device (e.g., the device 200a), or during a calibration after the device is deployed to a user. In some examples, portions of the operations described with respect to flow chart 400 are performed in a factory and portions are performed after the device is deployed to the user. The operations may be performed once (e.g., at the factory), or multiple times (e.g., periodically so as to account for changing behavior over time and/or varying conditions).

In block 402, the output power of each power amplifier in a phased array system is set to a nominal value, for example using an AGC value, and the power output of each power amplifier is measured and stored. For example, an output power of each power amplifier 310, 330, 350 and 370 may be set using a nominal AGC index value of 40 as shown in the exemplary calibration chart 600 in the column titled "AGC Index" and the power output measured by respective output power detectors PDETs, 316, 336, 356 and 376, as shown in the exemplary calibration chart 600 in the column titled "PDET". The AGC index value is a value that corresponds to an approximate desired power output. The power measurement value for each power amplifier 310, 330, 350 and 370 may be stored in a memory 298 associated with the data processor 210 (FIG. 2B). In some examples, output power of each power amplifier 310, 330, 350, and 370 is measured individually, for example one after another.

In block 404, a gain mismatch value associated with the power amplifiers in the phased array is determined. For example, with reference to the rows 605 in the column labeled "PDET" in the calibration chart 600 in FIG. 6, the output power detected at communication port 1 (power amplifier 310 of FIG. 3) is 14 dBm, the output power detected at communication port 2 (power amplifier 330 of FIG. 3) is 12.5 dBm, the output power detected at communication port 3 (power amplifier 350 of FIG. 3) is 12 dBm, and the output power detected at communication port 4 (power amplifier 370 of FIG. 3) is 13 dBm. In this example, the gain mismatch from the lowest power output to the highest power output is 2 dB.

In block 406, fine gain correction is applied among the power amplifiers to align the output power of each power amplifier to a particular value, for example the lowest measured value. For example, referring to the column labeled "PDET" in the calibration chart 600 in FIG. 6, it is determined that the lowest measured output power value was obtained from communication port 3 (power amplifier 350) at 12 dBm. Therefore, the example fine gain correction applied to the driver amplifiers 302, 322, 342 and 362 in the phased array aligns the output of each power amplifier to an output of approximately 12 dBm, which is the measured power output of the power amplifier 350 (communication port 3). For example, referring to the column labeled "Gain Adjustment" in the calibration chart 600 in FIG. 6, the driver amplifier 302 driving the power amplifier 310 associated with communication port 1 has its power reduced by 2 dB (−2 dB), so that the output of the power amplifier 310 is 12 dBm. Similarly, the driver amplifier 322 driving the power amplifier 330 associated with communication port 2 has its power reduced by 0.5 dB (−0.5 dB), so that the output of the power amplifier 330 is 12 dBm, and the driver amplifier 362 driving the power amplifier 370 associated with communication port 4 has its power reduced by 1 dB (−1 dB), so that the output of the power amplifier 370 is 12 dBm. In this manner, the power amplifiers associated with communication ports 1, 2, 3 and 4 are each controlled to have a nominal power output of 12 dBm.

In block 408, the power amplifiers are controlled so as to provide the nominal (desired) output power, for example using the AGC value. In this example, the desired nominal output power is 14 dBm. For example, referring to the column labeled "AGC Index" in the calibration chart 600 in FIG. 6, it is shown that the AGC index value provided to each driver amplifier 302, 322, 342 and 362 is set to 42, such that the power output of each power amplifier 310, 330, 350 and 370 is approximately a nominal 14 dBm. This is shown in the rows 610 and in the column labeled "PDET" in the calibration chart 600 in FIG. 6, whereby the power output of each power amplifier 310, 330, 350 and 370 when the AGC Index is 42 is the nominal output power of 14 dBm. The AGC index value may be adjusted while the gain adjustment values determined in block 406 are applied, as shown in rows 610. In this way, the output power of all power amplifiers may be set to be approximately equal (and to be approximately a desired output power).

In block 410, the input power of each power amplifier is measured. For example, respective input power detectors, RDET 306, 326, 346 and 366 serially or simultaneously measure the input power of the input signal provided to each power amplifier 310, 330, 350 and 370. For example, referring to the rows 610 and the column labeled "RDET" in the calibration chart 600 in FIG. 6, the input power at communication port 1 (power amplifier 310) is 190 mV, the input power at communication port 2 (power amplifier 330) is 193 mV, the input power at communication port 3 (power amplifier 350) is 198 mV, and the input power at communication port 4 (power amplifier 370) is 195 mV. From these input power measurements, it can be determined that the average input power (RDET_avg_cal) is 194 mV, and the highest measured input power (RDET_max_cal) is 198 mV.

In block 412, the input power measurements and/or values derived therefrom are stored. For example, the average input power, RDET_avg_cal (of 194 mV in this example), and the highest measured input power, RDET_max_cal (of 198 mV in this example) may be stored in (a non-volatile (NV) portion of) the memory 298 (FIG. 2B).

In block 414, the input power variation, RDET_variation, is determined. In an exemplary embodiment, the input power variation, RDET_variation may be determined according to:

RDET_variation=RDET_max_cal−RDET_avg_cal

In an exemplary embodiment, using the RDET values from the rows 610 and the column labeled "RDET" the value for RDET_variation may be determined to be RDET_max_cal, (198 mV) minus RDET_avg_cal (194 mV), resulting in an RDET_variation (ARDET_cal) of 4 mV.

In block 416, the value of RDET_variation (ARDET_cal=4 mV in this example) may be stored in (a non-volatile (NV) portion of) the memory 298 (FIG. 2B).

Figure 5:
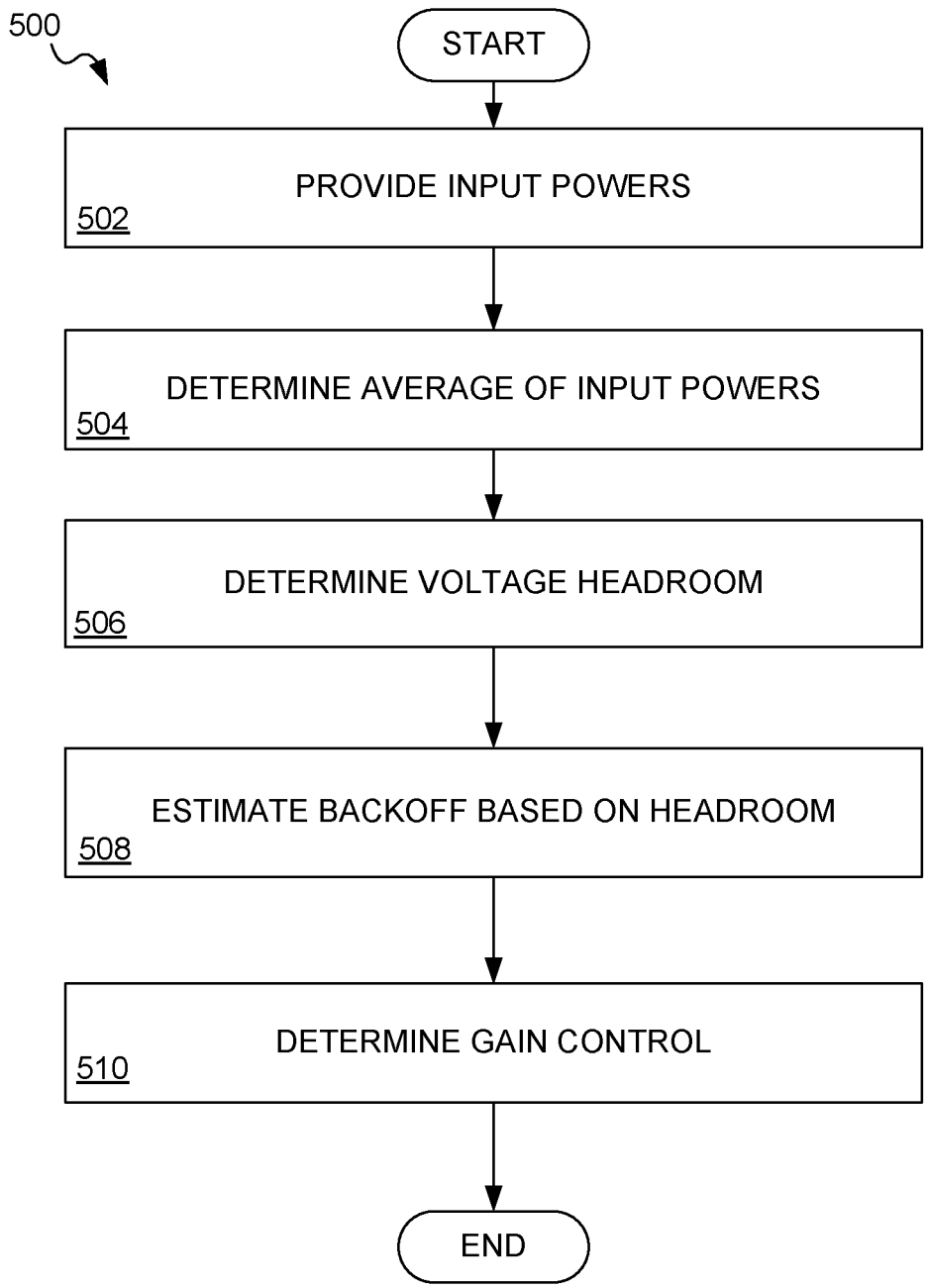
FIG. 5 is a flow chart describing an example of the operation of a method for input power detection and power amplifier output control.

FIG. 5 is a flow chart describing an example of the operation of a method 500 for input power detection and power amplifier output control. The blocks in the method 500 can be performed in or out of the order shown, and in some embodiments, can be performed at least in part in parallel. The description of the method 500 will also refer to the exemplary calibration chart 600 shown in FIG. 6; to a graph 700 shown in FIG. 7 that shows input power (vertical axis in mV) measured at each communication port (horizontal axis) (power amplifier); to an operation chart 708 shown in FIG. 7; and to a chart 800 shown in FIG. 8 that shows power amplifier backoff at different temperatures. In some examples, the operations described with respect to the method 500 are performed during operation (e.g., mission mode) of a device (e.g., the device 200a). For example, power measurement and averaging operations described with respect to at least blocks 502 and 504 may be performed within a single symbol period during transmission of a wireless communication. In some examples, all of the operations described with respect to the method 500 are performed during a single symbol period.

In block 502, input powers (e.g., for all power amplifiers being adjusted, for example for all power amplifiers in the phased array which are transmitting or scheduled to transmit) are simultaneously provided to the ADC 307. To facilitate such measurement, an input power detection event, also referred to as an RDET event, may be scheduled. For example, the input power detectors, RDETs, 306, 326, 346 and 366 may be configured to periodically determine input power for the respective power amplifiers 310, 330, 350 and 370 according to a pre-determined schedule. For example, the input power detectors, RDETs, 306, 326, 346 and 366 may be configured to provide the input power for the respective power amplifiers 310, 330, 350 and 370 to the ADC 307 every 500 ms, or another interval. In some examples, readback may be scheduled in a subsequent slot. In an exemplary embodiment, each RDET 306, 326, 346 and 366 may generate an analog voltage (for example, in mV) that represents respective input power of each power amplifier 310, 330, 350 and 370. This may occur two times (2X) for each power amplifier: one for each antenna polarization (e.g., vertical polarization, Vpol, and horizontal polarization, Hpol, or slant polarizations). The analog input voltages may be simultaneously provided to the analog-to-digital converter (ADC) 307 of FIG. 3 and may be averaged by the ADC 307. Simultaneously may refer to concurrent operation. For example, all of the RDETs, 306, 326, 346 and 366 may be operating approximately concurrently and may be providing a signal to the ADC 307 in overlapping times. Simultaneously may also refer to operation that is within a time required for the ADC 307 to compute an average. For example, even if several signals are not received at the ADC 307 at exactly the same time, if they are all available to the ADC 307 while the ADC is computing an average the signals may be considered to have been provided simultaneously. In some examples, simultaneously may refer to operation during a symbol or a shorter amount of time within the symbol.

In block 504, the analog input voltages provided to the ADC 307 are averaged. In an exemplary embodiment, the ADC 307 may develop a digital word that represents the average of the analog input voltages for the power amplifiers for each antenna polarization. In an exemplary embodiment, the ADC 307 generates two digital words representing the average power for the four exemplary power amplifiers 310, 330, 350 and 370 in this example, and for each of two antenna polarizations. In this example, the averaged RDET input power measurements taken from each of the power amplifiers 310, 330, 350 and 370 during operation (mission mode) will be referred to as RDET_avg_op to differentiate these mission mode measurements from the calibration mode averaged RDET measurements RDET_avg_cal. In an exemplary embodiment, input voltages measured and averaged during operation (blocks 502 and 504 of FIG. 5) may be the same or different than the input voltages measured during calibration (block 410 of FIG. 4). Therefore, the average of the input voltages generated in block 504 (RDET_avg_op) may be the same or different than the average of the input voltages described in block 410 (RDET_avg_cal). For example, during the calibration mode described in FIG. 4, the RDET measurements may be taken from individual power amplifiers and averaged by software in the data processor 210 (FIG. 2B) resulting in the average RDET_avg_cal. During the mission mode described in FIG. 5, the RDET measurement, RDET_avg_op, is an average of the input voltages from all the power amplifiers that happen to be active during operating conditions, which may include differences due to, for example, temperature variation. The average power amplifier input power may be referred to as RDET_avg_op in block 504 and may be determined by the ADC 307 (FIG. 3) in hardware, and may differ from RDET_avg_cal (block 410). In block 504, only the average, RDET_avg_op, input power of the active power amplifiers may be available, for example when input powers for multiple power amplifiers are provided at the same time. However, RDET_avg_cal and RDET_avg_op may be the same (or substantially the same) when measured under the same conditions (temperature, etc.).

In block 506, a variable referred to as "DISTANCE" is computed by the data processor 210 (FIG. 2B). In an exemplary embodiment, the variable DISTANCE represents a voltage level comprising the amount of voltage headroom between a power amplifier threshold voltage, THRESHOLD, and the sum of RDET_variation and RDET_avg_op, as shown in the below formula. Thus, the THRESHOLD may be compared to the sum of RDET_variation and RDET_avg_op (and in some examples, a headroom may not explicitly be calculated or determined; in some such examples, it may only be determined whether the sum of RDET_variation and RDET_avg_op is greater than the THRESHOLD).

DISTANCE=THRESHOLD−(RDET_variation+RDET_avg_op)

Figure 7:
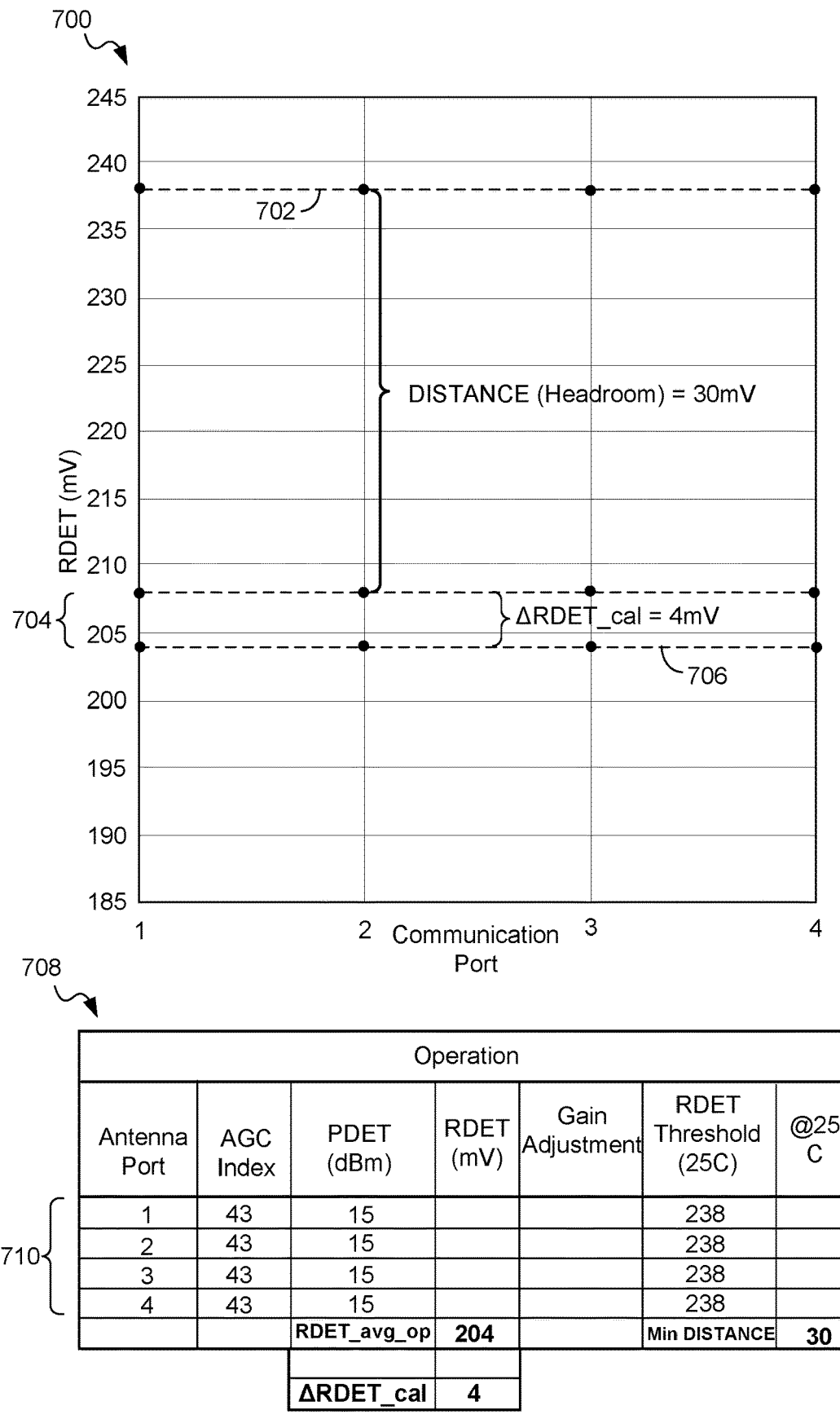
FIG. 7 is a graph showing input power measured at each communication port (power amplifier).

In the example shown in FIG. 7, referring to the rows 710 and the columns labeled "AGC Index" and "PDET (dBm)", of the operation chart 708, the AGC index is raised to 43 and the output power is nominally increased to 15 dBm over the calibration example shown in FIG. 6. Accordingly, the column labeled "RDET (mV)" in the operation chart 708 is blank indicating that individual input power measurements are not typically available in mission mode, but the average input power, RDET_avg_op, is available and in this example is shown as 204 mV. From the simultaneous input power values provided to the ADC 307 (FIG. 3), the ADC 307 can determine that the average input power (RDET_avg_op) is 204 mV in this example. In this operation example, because there are no individual input power measurements available, the highest measured input power (RDET_max) is unavailable. In this example, the value for DISTANCE may be determined by subtracting the value for RDET_variation (4 mV) and the value for RDET_avg_op (204 mV) from the THRESHOLD (238 mV) resulting in a minimum distance of 30 mV in this example.

In FIG. 7, the power amplifier threshold voltage, THRESHOLD, is shown in the graph 700 using reference numeral 702 (238 mV in this example), the value of RDET_variation (ARDET_cal) is shown using reference numeral 704 (4 mV in this example), and the value of RDET_avg_op is shown using reference numeral 706 (204 mV in this example). In this exemplary embodiment, RDET_avg_op (204 mV) is different than RDET_avg_cal (194 mV). However, as mentioned above, the values of RDET_avg_op and RDET_avg_cal may be the same if the conditions under which they are measured are the same or sufficiently similar.

In an exemplary embodiment, the threshold voltage, THRESHOLD, may be determined during characterization of the integrated circuit (IC) on which the power amplifiers 310, 330, 350 and 370 are located. In an exemplary embodiment, the threshold voltage, THRESHOLD, refers to the maximum allowable voltage swing at the input to each power amplifier 310, 330, 350 and 370 at a given temperature, before damage to the power amplifier occurs, resulting in a permanent drop in gain, output power, and/or linearity. The threshold voltage may vary over temperature. In an exemplary embodiment, at a nominal temperature of 25 degrees Centigrade (C), the threshold voltage, THRESHOLD, may be determined for each power amplifier. As shown in the exemplary calibration chart 600 in FIG. 6 and operation chart 708 in FIG. 7, the rows 610 and 710 and the column labeled "RDET Threshold (25 C)" indicate that the threshold voltage, THRESHOLD, is 238 mV at this temperature. Using the value for THRESHOLD, the minimum value for the variable DISTANCE may be determined. In this example, because the measured mission mode average power, RDET_avg_op, is 204 mV, in the column labeled "@25 C", the exemplary operation chart 708 also shows that for an average operating input power, RDET_avg_op, of 204 mV, the minimum value for the variable DISTANCE is 30 mV. Individual values in the column titled "@25 C" are not entered because in this operation example, individual RDET input power measurements are not available.

In block 508, based on the value of DISTANCE of 30 mV, a power backoff can be estimated. For example, power backoff values can be determined based on temperature, as shown by the exemplary chart 800 of FIG. 8. For example, at a temperature of 25 degrees C. and a DISTANCE value of 30 mV, the power backoff provided to the power amplifiers 310, 330, 350 and 370 will be 0dB. Similarly, at a temperature of 40 degrees C. and a DISTANCE value of 9 mV, the power backoff provided to the power amplifiers 310, 330, 350 and 370 will also be 0dB. In these instances, no power backoff is called for. However, at a temperature of 75 degrees C. and a DISTANCE value of −11 mV, the power backoff provided to the power amplifiers 310, 330, 350 and 370 (e.g., via adjusting the AGC value, see below) will be −0.18 dB; and at a temperature of 80 degrees C. and a DISTANCE value of −32 mV, the power backoff provided to the power amplifiers 310, 330, 350 and 370 (e.g., via adjusting the AGC value, see below) will be −0.50 dB. In this example, a negative value for DISTANCE indicates that the input power to that power amplifier has exceeded the voltage headroom (THRESHOLD) and should be reduced to prevent damage to the power amplifier. In some examples, if DISTANCE is less than a value other than zero (e.g., 5 (mV)), power is backed off.

In block 510, the value for DISTANCE is used to determine gain control for one or more of the amplifiers. For example, the AGC value may be adjusted such that input power provided to the power amplifiers is adjusted. In an exemplary embodiment, the backoff in dB can be determined based on:

$$dB\ BACKOFF = 10*\log 10(THRESHOLD) - 10*\log 10(THRESHOLD - DISTANCE)$$

The above formula determines the amount of power backoff, and can be correlated to the value of the AGC control signal.

Figure 9:
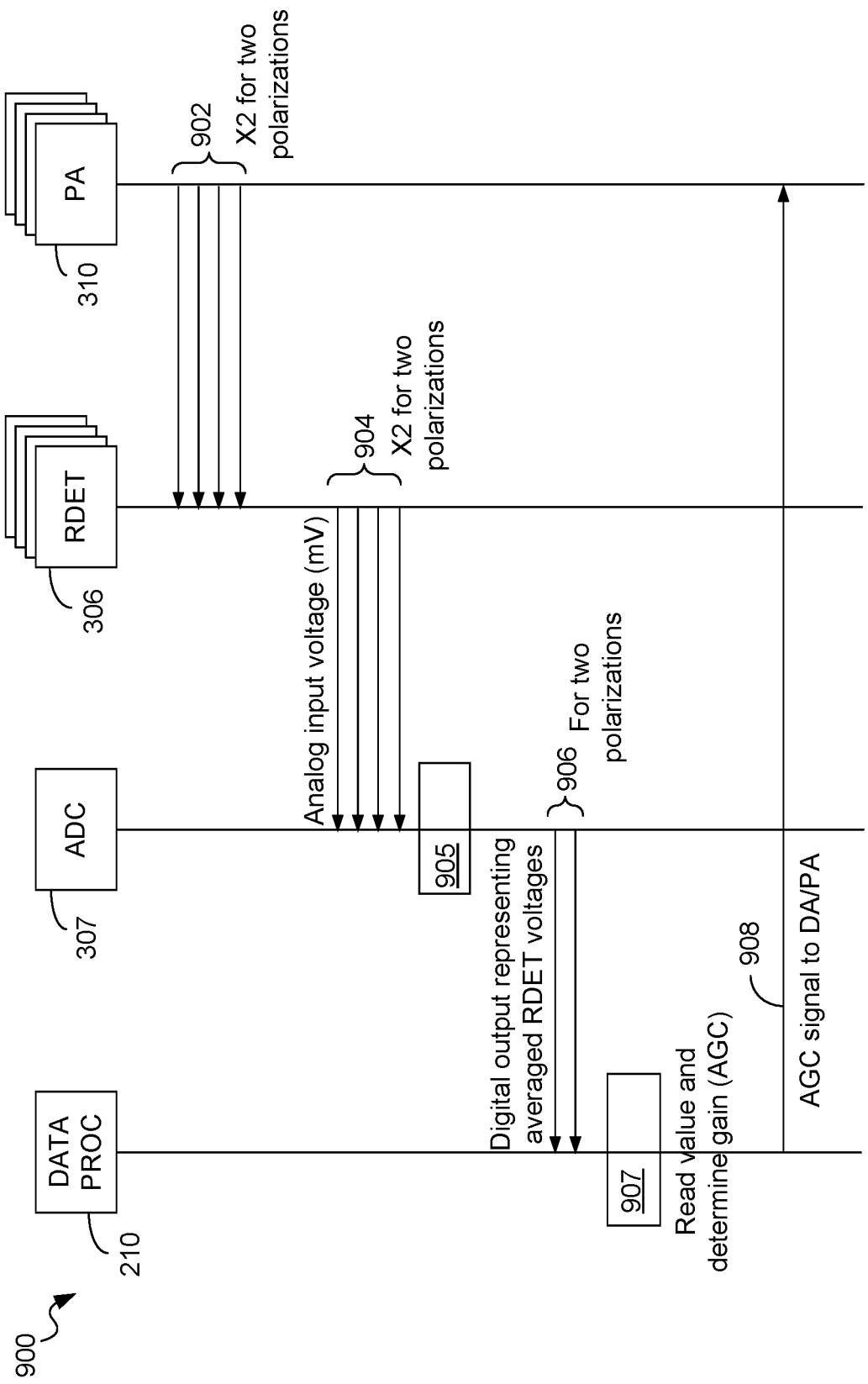
FIG. 9 is a call flow diagram showing an exemplary operation of input power detection and power amplifier output calibration.

FIG. 9 is a call flow diagram 900 showing an example of the operation of a method for input power detection and power amplifier output calibration. The call flow diagram 900 shows an exemplary power amplifier 310, and exemplary input power detector, RDET, 306, an exemplary ADC 307 and an exemplary data processor 210. Although a single power amplifier 310 and a single input power detector, RDET, 306 is shown in FIG. 9, it is assumed that the number of power amplifiers and RDETs will vary, as shown in FIG. 3, where four (4) power amplifiers and four (4) input power detectors, RDETs, are shown. In an exemplary embodiment, the ADC 307 may be the ADC 307 of FIG. 3, and the data processor 210 may be the data process or 210 of FIG. 2B.

In call 902, each input power detector, RDET, 306 receives a voltage signal representing the input power provided to a power amplifier 310. In the example shown in FIG. 9, four signals representing the input power of four power amplifiers are shown for each polarization. For example, a total of two instances of four voltage values, one for each polarization (e.g., one vertical polarization (Vpol) and one for horizontal polarization (Hpol), or one for two slant polarizations, etc.), may be included in call 902.

In call 904, each input power detector, RDET, 306 generates a voltage signal representing the input power provided to a power amplifier 310. In the example shown in FIG. 9, four signals representing the input power of four power amplifiers are shown for each polarization. For example, a total of two instances of four voltage values, one for each polarization may be included in call 904.

In block 905, the ADC 307 averages each of the (two instances of) four voltage values from the input power detector, RDET 306, and generates a single digital signal (word) representing the average power for each set of four voltage values. In an exemplary embodiment, the two digital signals (words) represent the average power for the four voltage values for each polarization.

In call 906, the digital signal(s) (words) are provided to the data processor 210 from the ADC 307. In this example, two words are provided to the data processor 210.

In block 907, the data processor 210 processes the two digital signals and develops a gain control signal (e.g., AGC signal, in the form of an AGC index value), that may be based on a backoff value to adjust the power amplifier(s), via respective VGA and/or driver amplifiers, based on the threshold voltage, THRESHOLD, the value for DISTANCE, the average input power, RDET_avg_op, and the input power variation, RDET_variation.

In call 908, the AGC signal used to provide the desired power is provided to an amplifier associated with each power amplifier 310 to control the power output of the power amplifier 310.

In an exemplary embodiment, the calibration process described in FIG. 4 can be done during device calibration where sufficient time is available, and the adjustment process of FIG. 5 can be done quickly (e.g., within a symbol period where inputs might quickly vary depending on the signals being transmitted) during device operation to ensure that the input power provided to each power amplifier does not exceed a level at which damage to the power amplifier(s) might occur.

Figure 10:
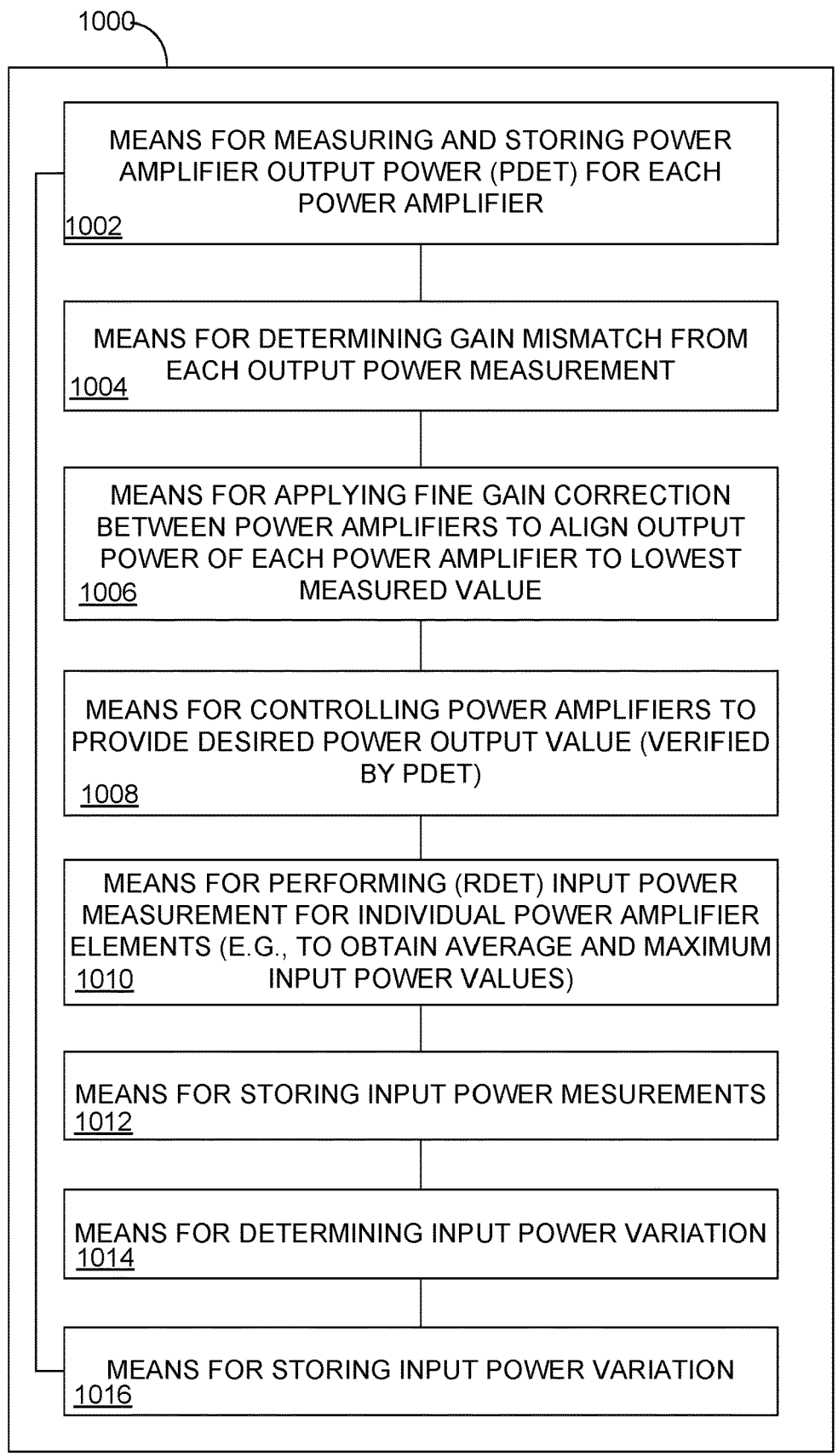
FIG. 10 is a functional block diagram of an apparatus for input power detection and power amplifier output calibration.

FIG. 10 is a functional block diagram of an apparatus for input power detection and power amplifier output calibration. The apparatus 1000 comprises means 1002 for measuring and storing the output power of each power amplifier in a phased array system. In certain embodiments, the means 1002 for measuring and storing the output power of each power amplifier in a phased array system can be configured to perform one or more of the functions described in operation block 402 of method 400 (FIG. 4). In an exemplary embodiment, the means 1002 for measuring and storing the output power of each power amplifier in a phased array system may comprise output power detectors PDETs, 316, 336, 356 and 376. The power measurement value for each power amplifier 310, 330, 350 and 370 may be stored in a memory 298 associated with the data processor 210 (FIG. 2B). The data processor 210 and/or VGA 284 may also be included in these means.

The apparatus 1000 may also comprise means 1004 for determining a gain mismatch value associated with the power amplifiers in the phased array system. In certain embodiments, the means 1004 for determining a gain mismatch value associated with the power amplifiers in the phased array system can be configured to perform one or more of the functions described in operation block 404 of method 400 (FIG. 4). In an exemplary embodiment, the means 1004 for determining a gain mismatch value associated with the power amplifiers in the phased array system may comprise the data processor 210. For example, in the operation described with respect to calibration chart 600 the data processor 210 may determine a gain mismatch among the output power detected at communication port 1 (power amplifier 310 of FIG. 3), which is 14 dBm, the output power detected at communication port 2 (power amplifier 330 of FIG. 3), which is 12.5 dBm, the output power detected at communication port 3 (power amplifier 350 of FIG. 3), which is 12 dBm, and the output power detected at communication port 4 (power amplifier 370 of FIG. 3), which is 13 dBm. In this example, the maximum gain difference is 2 dB.

The apparatus 1000 may also comprise means 1006 for applying fine gain correction among the power amplifiers to align the output power of each power amplifier to the lowest measured value. In certain embodiments, the means 1006 for applying fine gain correction among the power amplifiers to align the output power of each power amplifier to the lowest measured value can be configured to perform one or more of the functions described in operation block 406 of method 400 (FIG. 4). In an exemplary embodiment, the means 1006 for applying fine gain correction among the power amplifiers to align the output power of each power amplifier to the lowest measured value may comprise the data processor 210 and/or one or more of the driver amplifiers 302, 322, 342,

362. For example, the data processor 210 may be configured to reduce a gain of the driver amplifiers 302, 322, 342, 362 such that the outputs of the power amplifiers associated with communication ports 1, 2, 3 and 4 each have a nominal power output of 12 dBm.

The apparatus 1000 may also comprise means 1008 for controlling the power amplifiers to provide the nominal (desired) output power. In certain embodiments, the means 1008 for controlling the power amplifiers to provide the nominal (desired) output power can be configured to perform one or more of the functions described in operation block 408 of method 400 (FIG. 4). In an exemplary embodiment, the means 1008 for controlling the power amplifiers to provide the nominal (desired) output power may comprise the data processor 210 and/or VGA 284.

The apparatus 1000 may also comprise means 1010 for measuring the input power of each power amplifier. In certain embodiments, the means 1010 for measuring the input power of each power amplifier can be configured to perform one or more of the functions described in operation block 410 of method 400 (FIG. 4). In an exemplary embodiment, the means 1010 for measuring the input power of each power amplifier may comprise a respective input power detector, RDET 306, 326, 346 and 366, which may, for example, serially or simultaneously measure the input power of the input signal provided to each power amplifier 310, 330, 350 and 370.

The apparatus 1000 may also comprise means 1012 for storing the average input power, RDET_avg_cal, and the highest measured input power, RDET_max_cal. In certain embodiments, the means 1012 for storing the average input power, RDET_avg_cal, and the highest measured input power, RDET_max_cal can be configured to perform one or more of the functions described in operation block 412 of method 400 (FIG. 4). In an exemplary embodiment, the means 1012 for storing the average input power, RDET_avg_cal, and the highest measured input power, RDET_max_cal, may comprise (a non-volatile (NV) portion of) the memory 298 (FIG. 2B) and/or the data processor 210.

The apparatus 1000 may also comprise means 1014 for determining input power variation. In certain embodiments, the means 1014 for determining input power variation can be configured to perform one or more of the functions described in operation block 414 of method 400 (FIG. 4). In an exemplary embodiment, the means 1014 for determining input power variation may comprise the data processor 210. For example, the data processor 210 may be configured to determine the input power variation, RDET_variation, according to:

RDET_variation=RDET_max_cal−RDET_avg_cal

In an exemplary embodiment, using the RDET values from the rows 610 and the column labeled "RDET" the value for RDET_variation may be determined to be RDET_max_cal, (198 mV) minus RDET_avg_cal (194 mV), resulting in an RDET_variation (ARDET_cal) of 4 mV.

The apparatus 1000 may also comprise means 1016 for storing the input power variation. In certain embodiments, the means 1016 for storing the input power variation can be configured to perform one or more of the functions described in operation block 416 of method 400 (FIG. 4). In an exemplary embodiment, the means 1016 for storing the input power variation may comprise (a non-volatile (NV) portion of) the memory 298 (FIG. 2B) and/or the data processor 210.

Figure 11:
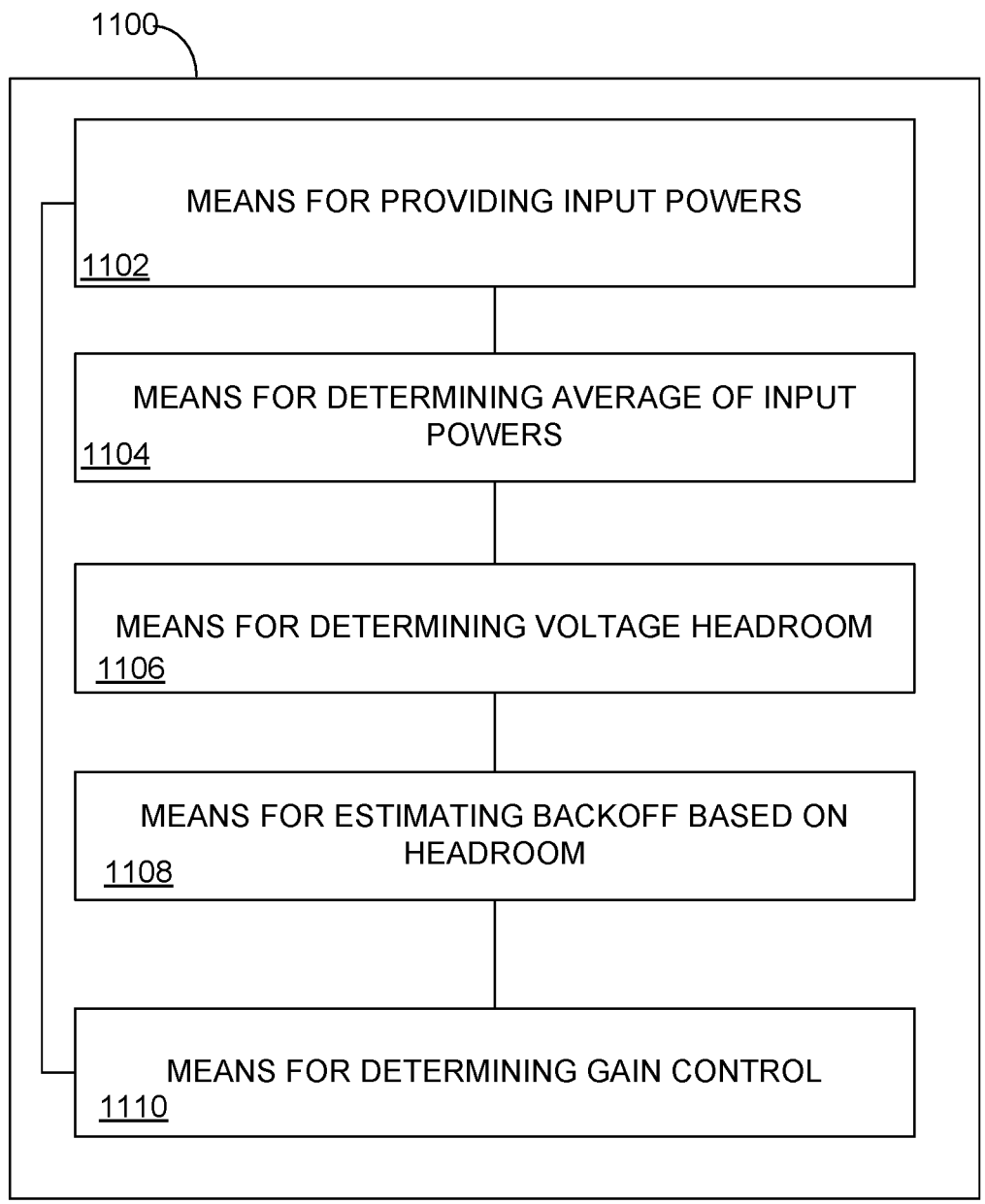
FIG. 11 is a functional block diagram of an apparatus for input power detection and power amplifier output calibration.

FIG. 11 is a functional block diagram of an apparatus for input power detection and power amplifier output calibration. The apparatus 1100 comprises means 1102 for providing input powers. In certain embodiments, the means 1102 for providing input powers can be configured to perform one or more of the functions described in operation block 502 of method 500 (FIG. 5). In an exemplary embodiment, the means 1102 for providing input powers may comprise the input power detectors, RDETs, 306, 326, 346 and 366. The input power detectors, RDETs, 306, 326, 346 and 366 may be configured to periodically provide input power for the respective power amplifiers 310, 330, 350 and 370 to the ADC 307 according to a pre-determined schedule. For example, the input power detectors, RDETs, 306, 326, 346 and 366 may be configured to provide input power for the respective power amplifiers 310, 330, 350 and 370 to the ADC 307 every 500 ms. In an exemplary embodiment, each RDET 306, 326, 346 and 366 may generate an analog voltage (for example, in mV) that represents respective input power of each power amplifier 310, 330, 350 and 370. This may occur two times (2X) for each power amplifier, one time for each of two antenna polarizations for each power amplifier. The analog input voltages may be provided to an analog-to-digital converter (e.g., ADC 307).

The apparatus 1100 may also comprise means 1104 for determining an average of all input powers. In certain embodiments, the means 1104 for determining an average of all input powers can be configured to perform one or more of the functions described in operation block 504 of method 500 (FIG. 5). In an exemplary embodiment, the means 1104 for determining an average of all input powers may comprise the ADC 307. For example, the ADC 307 may develop a digital word that represents the average of the analog input voltages for each power amplifier for each antenna polarization. In an exemplary embodiment, the ADC 307 generates two digital words representing the average power for the four exemplary power amplifiers 310, 330, 350 and 370 in this example, and for each of two antenna polarizations.

The apparatus 1100 may also comprise means 1106 for determining a voltage headroom. In certain embodiments, the means 1106 for determining a voltage headroom can be configured to perform one or more of the functions described in operation block 506 of method 500 (FIG. 5). In an exemplary embodiment, the means 1106 for determining a voltage headroom may comprise the data processor 210. For example, the data processor 210 may be configured to determine a variable referred to as "DISTANCE". In an exemplary embodiment, the variable DISTANCE represents a voltage level comprising the amount of voltage headroom between a power amplifier threshold voltage, THRESHOLD, and the sum of RDET_variation and RDET_avg_op, as shown in the below formula.

DISTANCE=THRESHOLD−(RDET_variation+RDET_avg_op)

The apparatus 1100 may also comprise means 1108 for estimating power backoff. In certain embodiments, the means 1108 for estimating power backoff can be configured to perform one or more of the functions described in operation block 508 of method 500 (FIG. 5). In an exemplary embodiment, the means 1108 for estimating power backoff may comprise the data processor 210. For example, the data processor 210 may be configured to estimate backoff voltage based on a value of DISTANCE of 30 mV in the example of FIG. 7.

The apparatus 1100 may also comprise means 1110 for determining gain control. In certain embodiments, the means 1110 for determining gain control can be configured to perform one or more of the functions described in operation block 510 of method 500 (FIG. 5). In an exemplary embodiment, the means 1110 for determining gain control may comprise the data processor 210 and/or the VGA 284. For example, the data processor 210 may be configured to use the value for DISTANCE to determine the gain control that can be used to control an input power to one or more of the power amplifiers, for example by controlling a VGA index value. In an exemplary embodiment, the backoff in dB can be determined based on:

$$dB\ BACKOFF=10*\log 10(THRESHOLD)-10*\log 10(THRESHOLD-DISTANCE)$$

The above formula determines the amount of power backoff, and corresponds to the value of the gain control signal provided to a power amplifier.

Implementation examples are described in the following numbered clauses:

1. A system for power amplifier control, comprising: a processor; a memory in communication with the processor, wherein the processor and the memory are configured to: simultaneously provide input signal strength of each of a plurality of power amplifiers in a millimeter wave (mmW) phased array system; determine an average input signal strength of the plurality of power amplifiers based on the provided input signal strengths using an analog-to-digital converter (ADC); determine a voltage headroom for the plurality of power amplifiers based on the determined average input signal strength; estimate a power backoff value based on the voltage headroom; and determine a gain control value based on the estimated power backoff value.

2. The system of clause 1, wherein the processor and memory are further configured to develop a digital word representing the average input signal strength of the plurality of power amplifiers.

3. The system of any of clauses 1 through 2, wherein the processor and memory are further configured to determine the voltage headroom (DISTANCE) for the plurality of power amplifiers based on a threshold input signal strength for the plurality of power amplifiers, a calibrated variation for the plurality of power amplifiers, and the determined average.

4. The system of clause 3, wherein the estimated power backoff value is determined using the threshold input signal strength and the voltage headroom.

5. The system of any of clauses 1 through 4, wherein the processor and the memory are configured to use the estimated power backoff value to determine an automatic gain control (AGC) signal for a variable gain amplifier coupled to the plurality of power amplifiers.

6. The system of any of clauses 3 through 5, wherein the calibrated variation is based on a calibrated maximum input power and a calibrated average input power.

7. The system of any of clauses 3 through 6, wherein the voltage headroom (DISTANCE) and the threshold input signal strength vary with temperature.

8. A method for power control, comprising: simultaneously providing input signal strength of each of a plurality of power amplifiers in a millimeter wave (mmW) phased array system; determining an average input signal strength of the plurality of power amplifiers based on the provided input signal strengths; determining a voltage headroom based on the determined average input signal strength; estimating a power backoff value based on the determined voltage headroom; and determining a gain control value to achieve the estimated power backoff value.

9. The method of clause 8, further comprising generating a digital word representing the average input signal strength of the plurality of power amplifiers.

10. The method of any of clauses 8 through 9, further comprising determining the voltage headroom (DISTANCE) for the plurality of power amplifiers based on a threshold input signal strength for the plurality of power amplifiers, a calibrated variation for the plurality of power amplifiers, and the determined average.

11. The method of clause 10, further comprising determining the estimated power backoff value using the threshold input signal strength, and the voltage headroom.

12. The method of any of clauses 8 through 11, further comprising using the estimated power backoff value to determine an automatic gain control (AGC) signal for a variable gain amplifier coupled to the plurality of power amplifiers.

13. The method of any of clauses 10 through 12, wherein the calibrated variation is based on a calibrated maximum input power and a calibrated average input power.

14. The method of any of clauses 10 through 13, wherein the voltage headroom (DISTANCE) and the threshold input signal strength vary with temperature.

15. A device, comprising: means for simultaneously providing input signal strength of each of a plurality of power amplifiers in a millimeter wave (mmW) phased array system; means for determining an average input signal strength of the plurality of power amplifiers based on the provided input signal strengths; means for determining a voltage headroom based on the determined average input signal strength; means for estimating a power backoff value based on the determined voltage headroom; and means for determining a gain control value to achieve the estimated power backoff value.

16. The device of clause 15, further comprising means for generating a digital word representing the average input signal strength of the plurality of power amplifiers.

17. The device of any of clauses 15 through 16, further comprising means for determining the voltage headroom (DISTANCE) for the plurality of power amplifiers based on a threshold input signal strength for the plurality of power amplifiers, a calibrated variation for the plurality of power amplifiers, and the determined average.

18. The device of clause 17, further comprising means for determining the estimated power backoff value using the threshold input signal strength, and the voltage headroom.

19. The device of any of clauses 15 through 18, further comprising means for using the estimated power backoff value to determine an automatic gain control (AGC) signal for a variable gain amplifier coupled to the plurality of power amplifiers.

20. The device of clause 17, wherein the calibrated variation is based on a calibrated maximum input power and a calibrated average input power.

21. The device of any of clauses 17 through 20, wherein the voltage headroom (DISTANCE) and the threshold input signal strength vary with temperature.

22. A power control system for a millimeter wave (mmW) communication system, comprising: a plurality of transmission paths, each transmission path having a power amplifier, and an input power detector; an analog-to-digital converter (ADC) coupled to each input power detector, the ADC configured to generate a single digital value for a plurality of input voltage signals corresponding to an input voltage of each power amplifier within a symbol; a variable gain amplifier (VGA) coupled to the plurality of transmission paths; and a processor configured to cause a control signal to be applied to the variable gain amplifier (VGA) responsive to the single digital value.

23. The power control system for a millimeter wave (mmW) communication system of clause 22, wherein the single digital value generated by the ADC represents an average input signal strength of the power amplifiers.

24. The power control system for a millimeter wave (mmW) communication system of any of clauses 22 through 23, wherein the processor is configured to calculate a voltage headroom (DISTANCE) based on a threshold input signal strength, a calibrated variation, and a determined average power represented by the single digital value.

25. The power control system for a millimeter wave (mmW) communication system of clause 24, wherein the processor is configured to determine an estimated power backoff value using the threshold input signal strength and the voltage headroom.

26. The power control system for a millimeter wave (mmW) communication system of clause 25, wherein the estimated power backoff value is used to determine the gain control signal provided by the VGA.

27. The power control system for a millimeter wave (mmW) communication system of any of clauses 24 through 26, wherein the calibrated variation is based on a calibrated maximum input power and a calibrated average input power.

28. The power control system for a millimeter wave (mmW) communication system of any of clauses 24 through 27, wherein the voltage headroom (DISTANCE) and the threshold input signal strength vary with temperature.

29. The power control system for a millimeter wave (mmW) communication system of any of clauses 22 through 28, wherein the plurality of input voltage signals correspond to a first antenna polarization, and wherein the ADC is configured to generate a second digital value for a second plurality of input voltage signals corresponding to a second antenna polarization.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A system for power amplifier control, comprising:
a processor;
a memory in communication with the processor, wherein the processor and the memory are configured to:
simultaneously provide input signal strength of each of a plurality of power amplifiers in a millimeter wave (mmW) phased array system;
determine an average input signal strength of the plurality of power amplifiers based on the provided input signal strengths using an analog-to-digital converter (ADC);
determine a voltage headroom for the plurality of power amplifiers based on the determined average input signal strength;
estimate a power backoff value based on the voltage headroom; and
determine a gain control value based on the estimated power backoff value.

2. The system of claim 1, wherein the processor and memory are further configured to develop a digital word representing the average input signal strength of the plurality of power amplifiers.

3. The system of claim 1, wherein the processor and memory are further configured to determine the voltage headroom (DISTANCE) for the plurality of power amplifiers based on a threshold input signal strength for the plurality of power amplifiers, a calibrated variation for the plurality of power amplifiers, and the determined average input signal strength.

4. The system of claim 3, wherein the estimated power backoff value is determined using the threshold input signal strength and the voltage headroom.

5. The system of claim 3, wherein the calibrated variation is based on a calibrated maximum input power and a calibrated average input power.

6. The system of claim 3, wherein the voltage headroom (DISTANCE) and the threshold input signal strength vary with temperature.

7. The system of claim 1, wherein the processor and the memory are configured to use the estimated power backoff value to determine an automatic gain control (AGC) signal for a variable gain amplifier coupled to the plurality of power amplifiers.

8. A method for power control, comprising:
simultaneously providing input signal strength of each of a plurality of power amplifiers in a millimeter wave (mmW) phased array system;
determining an average input signal strength of the plurality of power amplifiers based on the provided input signal strengths;
determining a voltage headroom based on the determined average input signal strength;
estimating a power backoff value based on the determined voltage headroom; and
determining a gain control value to achieve the estimated power backoff value.

9. The method of claim 8, further comprising generating a digital word representing the average input signal strength of the plurality of power amplifiers.

10. The method of claim 8, further comprising determining the voltage headroom (DISTANCE) for the plurality of power amplifiers based on a threshold input signal strength for the plurality of power amplifiers, a calibrated variation for the plurality of power amplifiers, and the determined average input signal strength.

11. The method of claim 10, further comprising determining the estimated power backoff value using the threshold input signal strength, and the voltage headroom.

12. The method of claim 10, wherein the calibrated variation is based on a calibrated maximum input power and a calibrated average input power.

13. The method of claim 10, wherein the voltage headroom (DISTANCE) and the threshold input signal strength vary with temperature.

14. The method of claim 8, further comprising using the estimated power backoff value to determine an automatic gain control (AGC) signal for a variable gain amplifier coupled to the plurality of power amplifiers.

15. A device, comprising:
 means for simultaneously providing input signal strength of each of a plurality of power amplifiers in a millimeter wave (mmW) phased array system;
 means for determining an average input signal strength of the plurality of power amplifiers based on the provided input signal strengths;
 means for determining a voltage headroom based on the determined average input signal strength;
 means for estimating a power backoff value based on the determined voltage headroom; and
 means for determining a gain control value to achieve the estimated power backoff value.

16. The device of claim 15, further comprising means for generating a digital word representing the average input signal strength of the plurality of power amplifiers.

17. The device of claim 15, further comprising means for determining the voltage headroom (DISTANCE) for the plurality of power amplifiers based on a threshold input signal strength for the plurality of power amplifiers, a calibrated variation for the plurality of power amplifiers, and the determined average input signal strength.

18. The device of claim 17, further comprising means for determining the estimated power backoff value using the threshold input signal strength, and the voltage headroom.

19. The device of claim 17, wherein the calibrated variation is based on a calibrated maximum input power and a calibrated average input power.

20. The device of claim 17, wherein the voltage headroom (DISTANCE) and the threshold input signal strength vary with temperature.

21. The device of claim 15, further comprising means for using the estimated power backoff value to determine an automatic gain control (AGC) signal for a variable gain amplifier coupled to the plurality of power amplifiers.

22. A power control system for a millimeter wave (mmW) communication system, comprising:
 a plurality of transmission paths, each transmission path having a power amplifier, and an input power detector;
 an analog-to-digital converter (ADC) coupled to each input power detector, the ADC configured to generate a single digital value for a plurality of input voltage signals corresponding to an input voltage of each power amplifier within a symbol;
 a variable gain amplifier (VGA) coupled to the plurality of transmission paths; and
 a processor configured to cause a control signal to be applied to the variable gain amplifier (VGA) responsive to the single digital value.

23. The power control system for a millimeter wave (mmW) communication system of claim 22, wherein the single digital value generated by the ADC represents an average input signal strength of the power amplifiers.

24. The power control system for a millimeter wave (mmW) communication system of claim 22, wherein the processor is configured to calculate a voltage headroom (DISTANCE) based on a threshold input signal strength, a calibrated variation, and a determined average power represented by the single digital value.

25. The power control system for a millimeter wave (mmW) communication system of claim 24, wherein the processor is configured to determine an estimated power backoff value using the threshold input signal strength and the voltage headroom.

26. The power control system for a millimeter wave (mmW) communication system of claim 25, wherein the estimated power backoff value is used to determine the control signal applied to the VGA.

27. The power control system for a millimeter wave (mmW) communication system of claim 24, wherein the calibrated variation is based on a calibrated maximum input power and a calibrated average input power.

28. The power control system for a millimeter wave (mmW) communication system of claim 24, wherein the voltage headroom (DISTANCE) and the threshold input signal strength vary with temperature.

29. The power control system for a millimeter wave (mmW) communication system of claim 22, wherein the plurality of input voltage signals correspond to a first antenna polarization, and wherein the ADC is configured to generate a second digital value for a second plurality of input voltage signals corresponding to a second antenna polarization.

* * * * *